(12) United States Patent
Castro et al.

(10) Patent No.: US 11,764,773 B2
(45) Date of Patent: Sep. 19, 2023

(54) CURRENT ABSORPTION MANAGEMENT CIRCUIT, CORRESPONDING SYSTEM AND METHOD

(71) Applicant: STMicroelectronics S.r.l., Agrate Brianza (IT)

(72) Inventors: Enrico Castro, Catania (IT); Giovanni Susinna, Catania (IT); Vincenzo Randazzo, Biancavilla (IT); Mirko Dondini, Catania (IT); Calogero Andrea Trecarichi, Gela (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/545,719

(22) Filed: Dec. 8, 2021

(65) Prior Publication Data

US 2022/0190816 A1 Jun. 16, 2022

(30) Foreign Application Priority Data

Dec. 11, 2020 (IT) .................. 102020000030575

(51) Int. Cl.
*H03K 17/082* (2006.01)
*H02H 9/02* (2006.01)

(52) U.S. Cl.
CPC ........... *H03K 17/0822* (2013.01); *H02H 9/02* (2013.01)

(58) Field of Classification Search
CPC .. H02H 3/08; H02H 3/087; H02H 9/001–004; H02H 9/02; H02H 9/025; H03K 17/0822
See application file for complete search history.

(56) References Cited

U.S. PATENT DOCUMENTS

| 5,030,844 A | 7/1991 | Li et al. |
| 2009/0257162 A1 | 10/2009 | Garrett |
| 2022/0352705 A1* | 11/2022 | Ramsauer ........... B60R 16/0232 |

FOREIGN PATENT DOCUMENTS

| EP | 3159992 A1 | 4/2017 |
| JP | 2001298861 A | 10/2001 |

OTHER PUBLICATIONS

IT Search Report and Written Opinion for priority application, IT 102020000030575, report dated Aug. 2, 2021, 11 pages.

* cited by examiner

*Primary Examiner* — Jared Fureman
*Assistant Examiner* — Christopher J Clark
(74) *Attorney, Agent, or Firm* — CROWE & DUNLEVY (57) ABSTRACT

Current absorption management for an electronic fuse coupled between an electrical supply source node and an electrical load node selectively controls a high current electronic switch and a low current electronic switch coupled in parallel between the electrical supply source node and the electrical load node. The high current and low current electronic switches are alternatively actuated: in a first mode where the high current electronic switch is turned on and the low current electronic switch is turned off, and in a second mode where the high current electronic switch is turned off and the low current electronic switch is turned on. Change to the second mode may be made in response to a standby state or a sensing of a lower current in the electrical load. Conversely, change to the first mode may be made in response to a sensing of a higher current in the electrical load.

28 Claims, 4 Drawing Sheets

CURRENT ABSORPTION MANAGEMENT CIRCUIT, CORRESPONDING SYSTEM AND METHOD

PRIORITY CLAIM

This application claims the priority benefit of Italian Application for Patent No. 102020000030575, filed on Dec. 11, 2020, the content of which is hereby incorporated by reference in its entirety to the maximum extent allowable by law.

TECHNICAL FIELD

The description relates to managing current absorption in electrical circuits.

One or more embodiments may be applied in electronic fuses for use in a variety of sectors. The automotive sector is an example of an area where embodiments can be used advantageously.

BACKGROUND

Electronic fuses (currently referred to also as e-fuses or eFuses) are active electronic devices capable of operating in an ON state or in an OFF state.

During the ON state, current flows to an associated load, and they sink a current which should be desirably biased; during the OFF state no current is intended to flow to an associated load.

In the presence of a reduced load, the current sunk by an eFuse in the ON state may drop and become small in comparison to a "normal" load current.

Electronic fuses are thus exemplary of devices where a current sunk in an ON state, albeit small, may end up by acting as a battery drainer during load quiescent states where the device cannot be switched to the OFF state in so far as a (small) current is still supplied to the load.

This militates against the possible use of such devices in applications that may involve prolonged standby state operation as may be the case of power distribution systems where devices such as eFuses may otherwise represent a viable replacement for conventional mechanical fuses.

Automotive power distribution applications where electronic fuses may effectively provide a primary protection function of the power distribution harness in a vehicle in possible combination with silicon integrated devices with high current/low RD Son profile are exemplary of such systems.

An active stand-by condition with a small current flowing to a load and the overall current consumption kept (very) low and the capability of switching on a main power switch (such as a power MOS transistor) quickly represent desirable features of devices for use in applications as discussed previously.

There is a need in the art to contribute in providing such desired features in a current absorption management circuit (such as an eFuse), while avoiding making the system more complex and less robust and/or more expensive in terms of module area, component count, or increased complexity at microcontroller (μC) level.

SUMMARY

One or more embodiments may relate to a circuit.

One or more embodiments may relate to a corresponding system. A power distribution system for use in the automotive sector may be exemplary of such a system.

One or more embodiments may relate to a corresponding method.

For the sake of simplicity and ease of understanding the embodiments illustrated herein will be discussed primarily in connection with possible application in an electronic fuse.

It will be otherwise understood that the embodiments are not linked by way of necessity to that application.

One or more embodiments may be applied, more generally, to those contexts where a low current absorption standby state and the capability of transitioning from such a low-consumption state to a full operating state quickly, with no appreciable discontinuities for the load and the system are desirable features.

One or more embodiments may include an integrated secondary switch, in parallel with a main power switch (a power MOS transistor, for instance), controlled by a low-current consumption driver to implement an ON standby state.

In one or more embodiments, such an ON standby state can be entered into in response to a direct command from a microcontroller. In one or more embodiments, a load current detection feature may be available to automatically detect load deactivation.

In one or more embodiments, a secondary switch may be integrated in a same device and automatically managed together with a main power switch.

In one or more embodiments, once an ON standby state is enabled, load re-activation can be automatically detected, which facilitates managing operation of the main power switch.

Circuit architecture according to embodiments lends itself to be implemented in various devices using different technologies. One or more embodiments facilitate obtaining (very) low current consumption in an ON standby state which results in reduced draining of current from a supply source (car battery, for instance) even in case of long-term application quiescence.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Also, throughout the figures, unless the context indicates otherwise, like parts or elements are indicated with like reference symbols, and a corresponding description will not be repeated for each and every figure for brevity.

As discussed, electronic fuses are generally exemplary of devices where a current sunk in an ON state, albeit small, may end up by acting as a battery drainer during load quiescent states where the device cannot be switched to the OFF state in so far as a (small) current is still supplied to the load.

Electronic fuses share with conventional mechanical fuses the basic role of protecting against overcurrents an electrical load coupled to a supply source (a battery voltage, in the case of automotive applications, for instance). Electronic fuses may however distinguish over conventional mechanical fuses (which, before possibly "burning", always draw a current from the supply source) due to their ability to be brought to a state where (at least notionally) no current is drawn from the supply source.

For the sake of simplicity and ease of understanding, the embodiments illustrated herein will be discussed primarily in connection with possible application in an electronic fuse.

It will be again recalled that the embodiments are not linked by way of necessity to that application: in fact, one or more embodiments may be applied, more generally, to those contexts where a low current absorption standby state and the capability of transitioning from such a low-consumption state to a full operating state quickly, with no appreciable discontinuities for the load and the system are desirable features.

Figure 1:
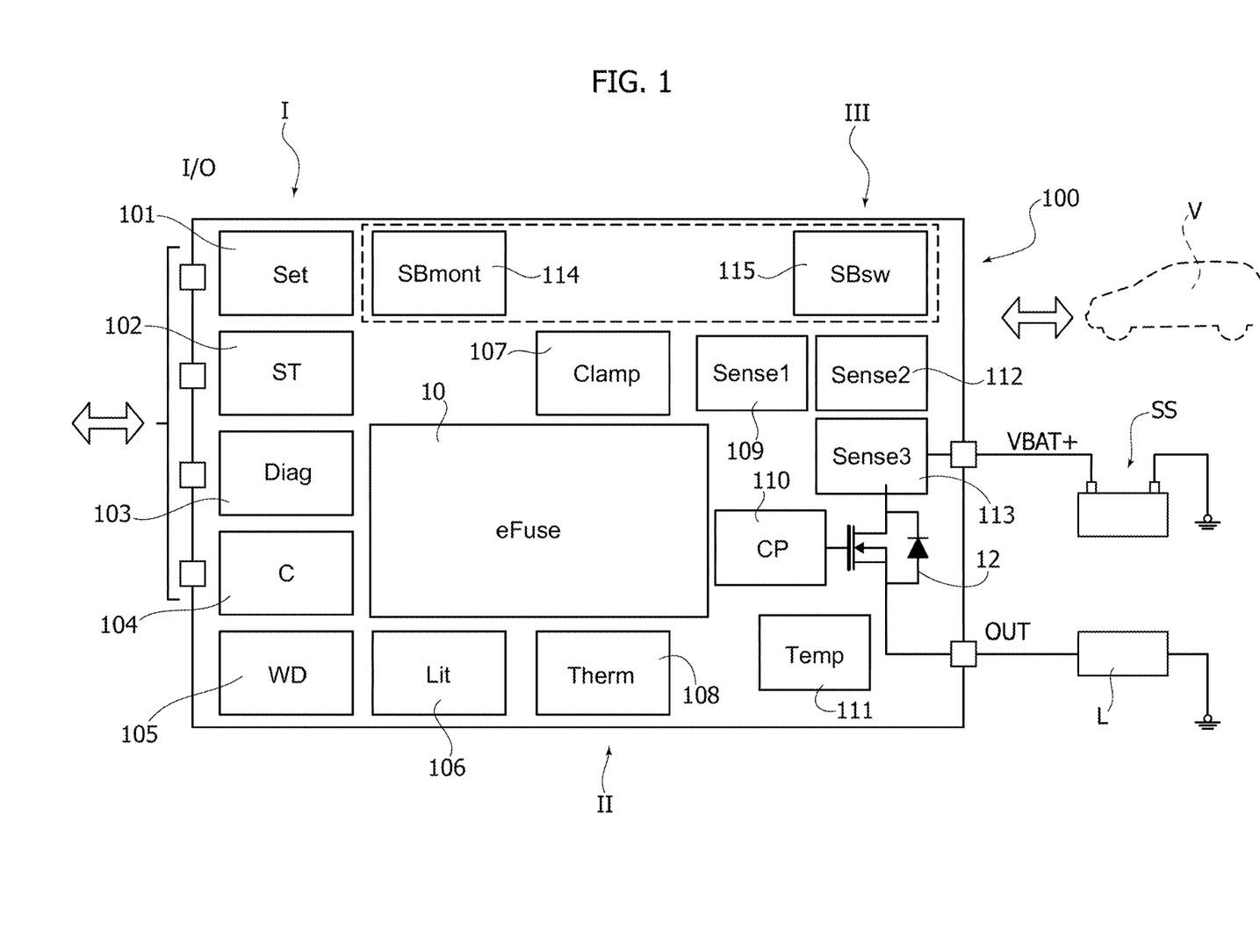
FIG. 1 is a functional block diagram of a system which may employ a current absorption management circuit as per embodiments of the present description.

The functional block diagram of FIG. 1 is generally illustrative of a system 100 which employs an "intelligent" current absorption management circuit (oftentimes referred to as an e-fuse or eFuse) 10.

A system 100 as illustrated in FIG. 1 is configured to controllably supply to an electrical load L energy drawn from a supply source SS.

In the (purely illustrative) representation of FIG. 1, the supply source SS is provided by a battery as may be the case of a system 100 equipping a vehicle V.

It will be appreciated that both the source SS and the load L may be distinct elements from the embodiments, and the system 100 may be intended to be coupled to the supply source SS (at a node VBAT+) and to the load L (at a node OUT) only when the system is installed and configured for operation.

As illustrated in FIG. 1, electrical supply of the load L is controlled via a (power) switch 12. A power MOS transistor (power MOSFET) may be exemplary of such a switch, such a device being capable of conducting a relatively high current between source and drain.

For simplicity and ease of explanation, the switch 12 is represented in FIG. 1 as an integral part of the system 100. The switch 12 may however be a distinct element from the embodiments.

As otherwise conventional in the art, a system 100 as illustrated in the functional block diagram of FIG. 1 may include a wide palette of functionalities.

As illustrated in FIG. 1, these functionalities may be arranged in:

a first section I, which includes system and safety-related functions co-operating with an I/O interface (on the left-hand side of FIG. 1) such as, for instance, parameter setting (Set) 101, self-test (ST) 102, diagnostic (Diag) 103, control (C) 104, watchdog (WD) 105 and limp-home (LH) 106 functionalities;

a second section II, which includes power MOSFET protections such as, for instance, back electro-motive force (BEMF) clamping (Clamp) 107 and thermal protection (Therm) 108 functionalities; and a third section III, which includes power MOSFET gate driver and sensor functionalities such as, for instance, output voltage sensing (Sense1) 109, charge pump (CP) 110, junction temperature sensing (Temp) 111, supply voltage (VBAT+) sensing (Sense2) 112 and current sensing (Sense3) 113 functionalities.

In general terms, and unless indicated otherwise in the following, system architecture as exemplified in FIG. 1 can be regarded as conventional in the art, which makes it unnecessary to provide a more detailed description.

Embodiments as exemplified herein are primarily concerned with possible interplay of the functionality 10 with the other functionalities in the architecture, for instance with the power switch 12 and the current sensing functionality 113.

Figure 2:
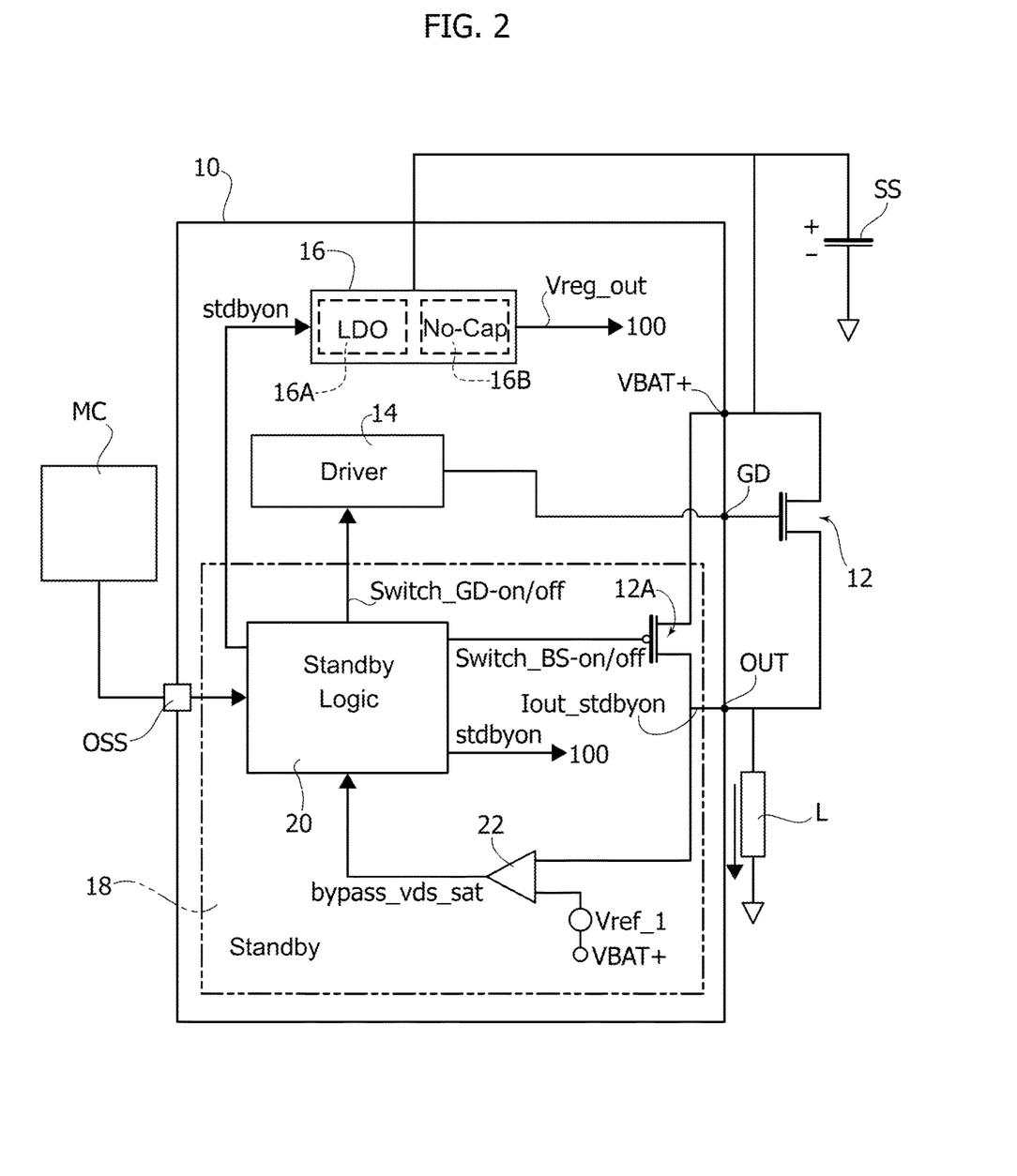
FIG. 2 is a block diagram exemplary of a first possible option in implementing embodiments of the present description.
Figure 3:
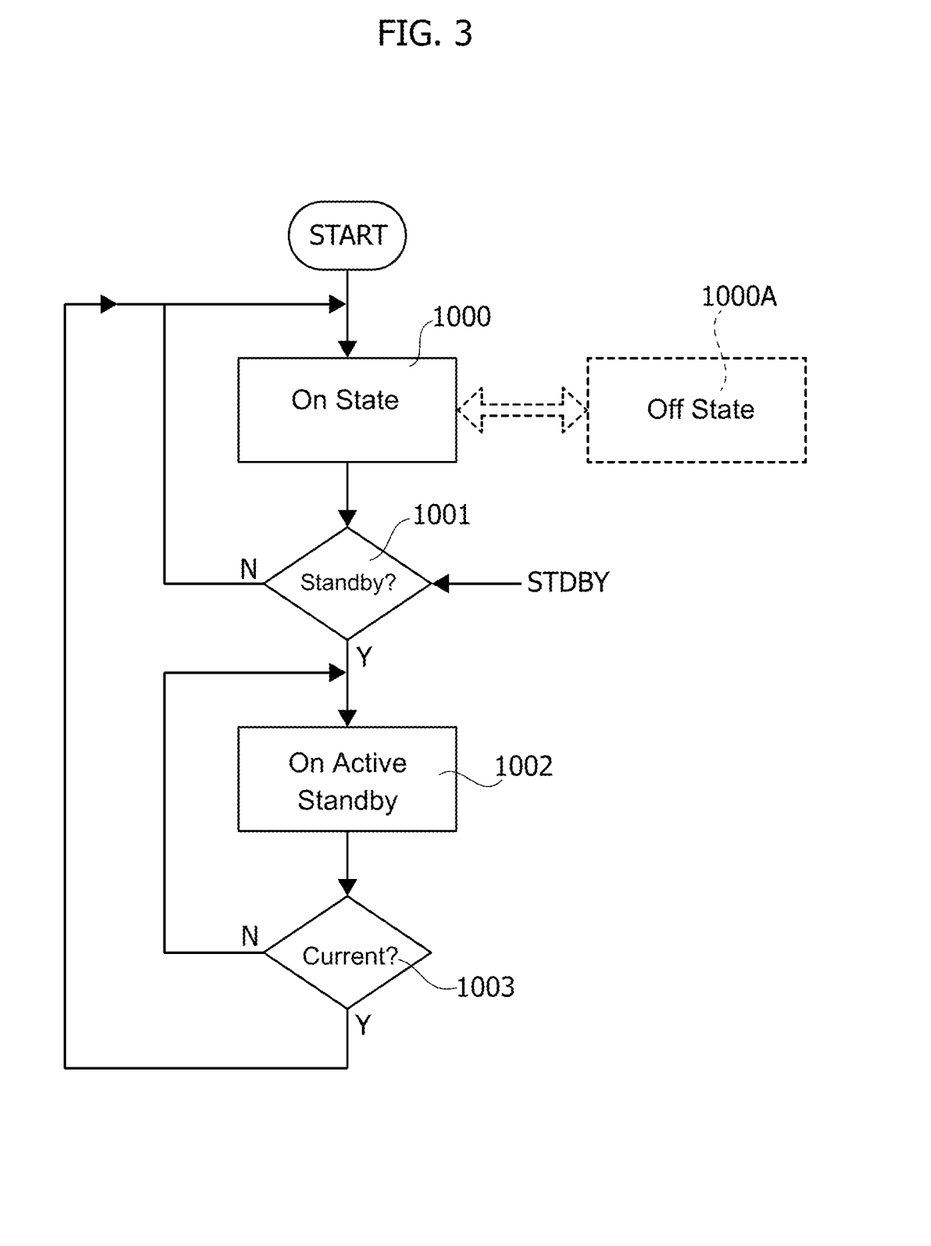
FIG. 3 is a flow-chart exemplary of possible operation of embodiments according to FIG. 2.

This may occur, for instance, via standby monitoring (SBmont) and standby switch (SBsw) functionalities as generally represented by blocks 114 and 115 in FIG. 1 and suited to be implemented as exemplified in FIGS. 2 and 3.

For that reason, various possible implementation options of the functional architecture of FIG. 1 will now be discussed by placing emphasis on co-operation of the functionality 10 with the other functionalities in the architecture with the power switch 12.

To that effect, the power switch 12 is shown having a current path therethrough (source-drain in the case of a field-effect transistor such as a MOSFET transistor) coupled between the supply source SS (at a node VBAT+) and the load L (at a node OUT).

As noted, the load L can be notionally any kind of electrical load; the embodiments are thus largely "transparent" to the nature and characteristics of the load L.

By way of general reference, two types of implementation options will be discussed in connection with FIGS. 2 to 4 as exemplary of possible variants where:

the power switch 12 may be external to (and thus distinct from) the circuit 10, in contrast to the representation of FIG. 1, where the switch 12 is included in the circuit 10, and/or the circuit 10 can switch to a low-current consumption state (ON standby state) where a small current is delivered to the load, either in response to a command from an external controller (a microcontroller or μC, for instance, as discussed in connection with FIG. 2) or as a result of automatic enablement of that state in the absence of an external command (as discussed in connection with FIG. 4).

As noted, for the sake of simplicity and ease of explanation, unless indicated otherwise, throughout the figures like parts or elements are indicated with like reference symbols and a corresponding description will not be repeated for each and every figure for brevity.

Also, features and details discussed in connection with one implementation option can be applied, singly or in combination, in another implementation option. That is, a feature or detail being here illustrated, singly or in combination, within the framework of one implementation option shall not be construed as an indication that such a feature or detail can be used exclusively in the implementation option where the features or detail is illustrated herein.

In FIG. 2, a current absorption management circuit 10 is illustrated coupled to a supply source SS (at a node VBAT+) and to a load L (at a node OUT) in order to control current supply to the load L via a power switch 12.

The current path through the power switch 12 (source-drain in the case of a field-effect transistor such as a MOSFET transistor) is thus coupled between the supply source SS and the load L, so that load energization, that is current flow through the load, is:

facilitated (permitted) in response to the switch 12 being turned ON, namely made conductive, and countered (prevented) in response to the switch 12 being turned OFF, namely made non-conductive.

The power switch 12 can be alternatively switched on (that is, made conductive) and off (that is, made non-conductive) via a drive signal produced by a driver 14 and applied via a node GD to the control node (gate, in the case of a field-effect transistor such as a MOSFET transistor) of the power switch 12.

Reference 16 indicates a voltage regulator coupled to the supply source SS and configured (in a manner known per se to those of skill in the art) to provide a regulated supply voltage Vreg_out to the other parts of the device 100 as illustrated in the functional block diagram of FIG. 1.

As discussed in the following, the voltage regulator may comprise a high-power section 16A (LDO, for instance) and a low-power section 16B (a no-cap pre-regulator, for instance).

Reference 18 denotes as a whole a part (subsystem) of the circuit 10 devoted to managing a standby state of the circuit 10 as discussed in the following.

This may occur in response to a standby signal received at an input node OSS from a controller MC (a microcontroller or μC, for instance). As illustrated, the controller MC may be an external controller, distinct from the circuit 10.

As illustrated in FIG. 2, the subsystem 18 comprises active standby logic circuitry 20 sensitive to a signal received at the node OSS from the controller MC as well as to a wake-up signal bypass_vds_sat from a comparator 22 which compares with a reference (voltage) threshold Vref_1 a signal which indicates the intensity of the current flowing into the load L at the node OUT and which, as discussed in the following, can be used to facilitate (quick) re-activation of the main switch 12 to a conductive state.

Such a re-activation signal may be obtained (in a manner known per se to those of skill in the art) via a current sensing functionality such as 113 in FIG. 1.

As illustrated herein, such a re-activation signal may be simply obtained as a result of a feedback action based on the value of the voltage at the node OUT compared in a comparator 22 with a (possibly adjustable) threshold Vref_1 referred to the supply voltage VBAT+.

The voltage at the node OUT (and thus the voltage drop between the voltage at the node VBAT+ and the voltage at the node OUT) can be reasonably assumed to be a function of the output current. In fact, an electronic switch in a conductive state can be regarded as a resistor having a resistance value, such as RDSon in the case of a field-effect transistor such as a MOSFET transistor.

Consequently, a signal adapted to be supplied to the comparator 22 for comparison with the threshold Vref_1 can be simply obtained by monitoring the voltage at the node OUT.

In one or more embodiments, a secondary bypass switch 12A such as a (low-power) MOSFET transistor (p-channel for instance) may be coupled across the nodes VBAT+ and OUT thus having the current path therethrough (source-drain in the case of a field-effect transistor such as a MOSFET transistor) coupled between the supply source SS and the load L. The switch 12A device being capable of conducting a relatively low current between source and drain (i.e., substantially lower than the high current capability of the power switch 12).

Stated otherwise, the re-activation signal may be simply obtained as a result of a feedback action based on the value of the voltage at the node OUT, that is by monitoring the (source-drain) voltage drop across the secondary bypass switch 12A.

As illustrated in FIG. 2 the logic circuitry 20 is configured to produce:

a first signal Switch_GD-on/off which is applied (via the driver circuit 14) to the control node (gate, in the case of a field-effect transistor such as a MOSFET transistor) of the power switch 12 to turn it alternatively on (conductive) and off (non-conductive), a second signal Switch_BS-on/off which is applied to the control node (gate, in the case of a field-effect transistor such as a MOSFET transistor) of the secondary switch 12A to turn it alternatively on (conductive) and off (non-conductive), a third signal stdbyon which is distributed to the other parts of the device 100 as illustrated in the functional block diagram of FIG. 1 (supply of the signal stdbyon to the voltage regulator 16 is explicitly represented in the upper portion of FIG. 2).

A possible sequence of operation of the circuit 10 may contemplate an ON active-standby state.

This may be in addition to the conventional ON and OFF states of an electronic fuse, that is:

an ON state (see also block 1000 in the flow-chart of FIG. 3, discussed in the following), during which the load L (fully) energized with the load L coupled to the supply source SS through the switch 12 made conductive (with the switch 12A non-conductive), and an OFF state (see also block 1000A in the flow-chart of FIG. 3), during which the switch 12 de-couples the load L from the supply source SS as a result of the switch 12 (as well as the switch 12A) being made non-conductive; such an OFF state may be entered into in response to an overcurrent event as detected at 113 in FIG. 1, for instance.

Operation of a device 100 as illustrated in FIG. 1 in those two ON and OFF states (see blocks 1000 and 1000A in the flow-chart of FIG. 3) is conventional in the art, which makes it unnecessary to provide a more detailed description herein.

Also, it will be again recalled that application to an electronic fuse is considered herein merely by way of non-limiting example.

The embodiments are not linked by way of necessity to being applied in electronic fuses in so far as an ON active-standby state may be advantageous in various devices where it is desired that a small current may still flow to a load such as L while the overall current consumption of the circuit 10 is very low (less than 50 μA, for instance, thus improving battery lifetime).

The capability of switching to a (full) ON state with the power switch 12 turned quickly on (within 50-100 µs since a normal load current is requested, for instance) is likewise desirable.

Operation of an implementation option as illustrated in FIG. 2 is exemplified in the flow-chart of FIG. 3 assuming that after START the circuit 10 is in the (full) ON state as exemplified by block 1000.

As noted, the switch 12 may be turned off (made non-conductive—OFF state 1000A) in order to de-couple the load L from the supply source SS in response to an over-current event in eFuse operation. As noted, this is conventional in the art (which makes it unnecessary to provide a more detailed description herein) and likewise not mandatory for the embodiments.

Switching to the low-power-consumption ON active-standby state may be prompted by the occurrence of a triggering action as exemplified at STDBY.

This may be indicated by a positive outcome Y of a check at block 1001; in the presence of a negative outcome N the circuit simply loops back upstream thus maintaining the (full) ON state.

The triggering action exemplified at STDBY may involve the input node OSS being asserted (brought high, for instance) for a minimum time by the controller MC, while the circuit 10 is in the ON state, with the switch 12 conductive and the load L energized by the supply source SS.

The input node OSS being asserted may be recognized by the device 10 as a command to enable the ON active-standby state. This command may be validated, for instance, as a result of the input node OSS being pulled-down, that is, brought to a low level.

In response to entering the ON active-standby state (as exemplified by block 1002 in FIG. 3), the logic circuitry 20 may:

on the one hand, disable the main switch 12 via the driver 14 (signal Switch_GD-on/off indicating an off condition desired where the supply source SS is no longer coupled to the load L via the switch 12), and on the other hand, enable the secondary switch 12A to maintain a reduced current supply (350 mA-500 mA, for instance) to the load L.

During the ON active-standby state, if the current supplied to the load L exceeds a threshold Iout_stdbyon (500 mA@VBAT+=13V, T=25° C., for instance)—which corresponds to a positive outcome Y of a check exemplified by block 1003 in FIG. 3—the logic circuitry 20 may switch back to the (full) ON state by:

on the one hand, re-enabling the main switch 12 via the driver 14 (signal Switch_GD-on/off indicating an on condition desired), which can occur very rapidly;

on the other hand, disabling the secondary switch 12A.

In the presence of a negative outcome N of the check represented by block 1003, the circuit simply loops back upstream thus maintaining the ON active-standby state.

The related information on the intensity of the current supplied to the load L can be provided to the logic circuitry 20 via the comparator 22 in response to the comparison therein indicating that intensity of the current through the load L (indicated, for instance, by the re-activation signal which—as discussed in the foregoing—can be obtained as a result of a feedback action based on the voltage at the node OUT) has increased up to an intensity threshold as represented by Vref_1.

For instance, the circuit 10 can be configured so that if, during the ON active-standby state with, e.g., Iout<350 mA any pin (with possible exceptions as represented, for instance, by the OSS node) is pulled up, the device 100 will go back to the (full) ON state, re-activating the power switch 12 and de-activating the secondary switch 12A.

Of course, the quantitative figures given herein are merely exemplary and non-limiting of the embodiments.

The signal stdbyon (which is indicative of the ON active-standby state being enabled and is distributed by the logic circuitry to the other parts of the device 100) can be exploited in the voltage regulator 16 to selectively enable:

the high-power (and higher consumption) regulator 16A, such as a low dropout (LDO) regulator, during the (full) ON state with the power switch 12 turned on and the secondary switch 12A turned off; or a low-power (and low-consumption) voltage pre-regulator 16B, during the ON active-standby state with the power switch 12 turned off and the secondary switch 12A turned on.

More generally, as represented in FIG. 2 by the signal stdbyon from the logic circuitry 20 distributed to the various other functionalities in the architecture 100 of FIG. 1, a current absorption management circuit as illustrated herein facilitates switching to a low-consumption state (notionally turning-off) these functionalities, thus dramatically reducing energy absorption.

This advantageously facilitates further reducing energy absorption from the supply source SS during the ON active-standby state.

Also, waking-up from such a low-consumption state to a full operating state may take place quickly, with no appreciable discontinuities for the load L and the system as a whole.

Figure 4:
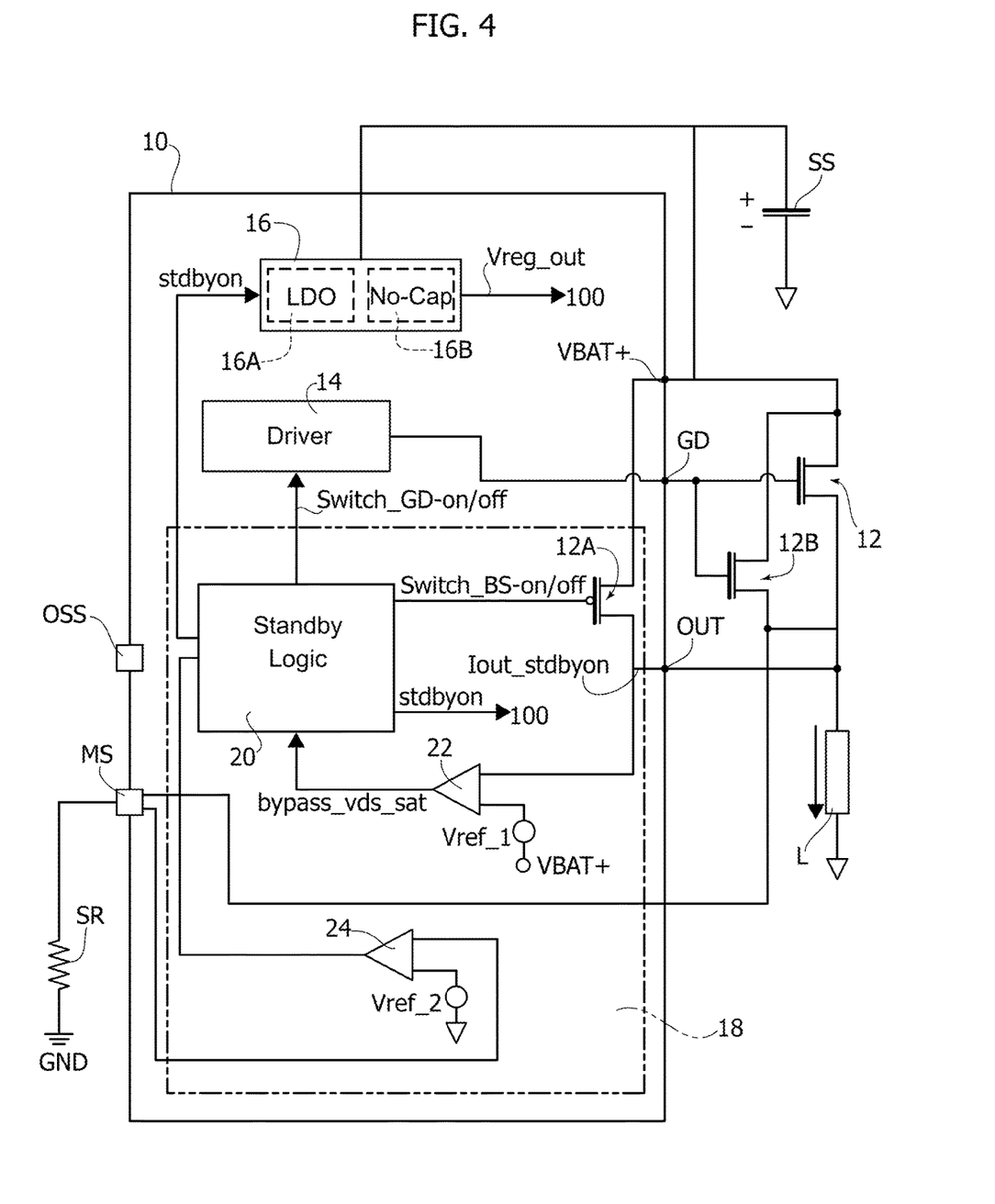
FIG. 4 is a block diagram exemplary of a second possible option in implementing embodiments of the present description.

In FIG. 4, unless the context indicates otherwise, parts or elements like parts or elements already discussed in connection with the previous figures are indicated with like reference symbols, so that a corresponding description will not be repeated for brevity.

FIG. 4 is exemplary of an implementation where the triggering action as exemplified at STDBY in the flowchart of FIG. 3 may result from a sensing action of the current through the load L with a command provided by an external controller MC no longer involved.

In a circuit 10 as illustrated in FIG. 4, a sensing transistor 12B (a MOSFET transistor, for instance) is provided having the current path therethrough (source-drain in the case of a field-effect transistor such as a MOSFET transistor, for instance) coupled across the nodes VBAT+ and OUT and the control node (gate, in the case of a field-effect transistor such as a MOSFET transistor, for instance) coupled to the control node GD (again gate, in the case of a field-effect transistor such as a MOSFET transistor) of the power switch 12.

The current (feedback) path through the sensing transistor 12B is also coupled to a (multi)sensing node MS configured to be coupled to ground GND, optionally via an (e.g., external) sensing resistor SR.

Reference 24 denotes in FIG. 4 a further comparator which compares the (e.g., voltage) signal at the node MS with a further (possibly adjustable) threshold Vref_2 referenced to ground. The output signal from the comparator 24 is applied to the logic circuitry 20.

During the (full) ON state, a device as illustrated in FIG. 4 will be able to detect (via the feedback current sensing network 12B, SR which supplies the comparator 24 with the signal compared with the threshold Vref_2) a condition where the current through the main switch 12, and thus through the load L, has decreased reaching a lower threshold value as defined by Vref_2 (250 mA@VBAT=+13V, T=25° C., for instance).

Optionally, the sensing network 12B, SR may be configured to operate with a very low current density and the resistance SR can be accordingly chosen (a resistance value of 420 KOhm was found to be a sensible choice) to generate Vms=4,15V @Iout=250 mA.

Here again, these quantitative figures are merely exemplary and non-limiting of the embodiments.

When such detection occurs (see STDBY in FIG. 3), the circuit will automatically enter the ON active stand-by state as represented by block 1002 in the flow-chart of FIG. 3 after a fixed time (about 150 μs, for instance).

Here again, during the ON active-standby state, if the current supplied to the load L exceeds a threshold Iout_stdbyon (500 mA@VBAT+=13V, T=25° C., for instance) as indicated by a positive outcome Y of the check represented by block 1003, the logic circuitry 20 may switch back to the (full) ON state. In the presence of a negative outcome N of the check represented by block 1003, the circuit simply loops back upstream thus maintaining the ON active-standby state.

In the case exemplified in FIG. 4, the related information on the intensity of the current supplied to the load L can be provided to the logic circuitry 20 via the comparator 22 as discussed previously in connection with FIG. 2, namely as a result of a feedback action based on the voltage at the node OUT.

Here again, the circuit 10 can be configured so that if, during the ON active-standby state with, e.g., Iout<350 mA, any pin (with possible exceptions as represented, for instance, by the OSS node) is pulled up, the device 100 will go back to the (full) ON state, re-activating the power switch 12 and de-activating the secondary switch 12A.

Once more, the signal stdbyon which is indicative of the ON active-standby state being enabled and is distributed by the logic circuitry to the other parts of the device 100 may be exploited in the voltage regulator 16 to selectively enable:

a high-power (and higher consumption) regulator 16A, such as a low dropout (LDO) regulator, activatable during the (full) ON state with the power switch 12 turned on and the secondary switch 12A turned off; or a low-power (and low-consumption) voltage pre-regulator 16B, activatable during the ON active-standby state with the power switch 12 turned off and the secondary switch 12A turned on.

More generally, as represented also in FIG. 4 by the signal stdbyon from the logic circuitry 20 distributed to the various other functionalities in the architecture 100 of FIG. 1, a current absorption management circuit as illustrated herein facilitates switching to a low-consumption state (notionally turning-off) these functionalities, thus dramatically reducing energy absorption.

This advantageously facilitates further reducing energy absorption from the supply source SS during the ON active-standby state.

Also, waking-up from such a low-consumption state to a full operating state may take place quickly, with no appreciable discontinuities for the load L and the system as a whole.

Briefly, a circuit as exemplified herein (for instance, 10) may comprise:

a first node (for instance, VBAT+) and a second node (for instance, OUT) configured to be coupled (respectively) to an electrical supply source (for instance, SS) and to an electrical load (for instance, L) configured to be supplied by the electrical supply source (for instance, SS) via an electronic switch (for instance, 12) having a control node; and a third node (for instance, GD) configured to be coupled to the control node of the electronic switch to switch the electronic switch between a conductive state (for instance, 1000), wherein the electrical load is coupled to the supply source via the electronic switch, and a non-conductive state (for instance, 1000A, wherein the electrical load may not be coupled to the supply source via the electronic switch).

A circuit as exemplified herein may (further) comprise:

a secondary electronic switch (for instance, 12A) intermediate the first node and the second node;

control logic circuitry (for instance, 20) coupled to said third node and said secondary electronic switch to provide a first switch control signal (for instance, Switch_GD-on/off) applied (for instance, via 14) to said third node and a second switch control signal (for instance, Switch_BS-on/off) to the secondary electronic switch, the control logic circuitry (20) configured to provide the first switch control signal and the second switch control signal, alternately:

in a first mode of operation (for instance, 1000), wherein the first switch control signal drives the electronic switch to the conductive state and the second switch control signal drives the secondary electronic switch to a non-conductive state; and in a second mode of operation (for instance, 1002), wherein the first switch control signal drives the electronic switch to the non-conductive state and the second switch control signal drives the secondary electronic switch to a conductive state, wherein the electrical load is coupled to the supply source via the secondary electronic switch.

A circuit as exemplified herein may comprise a fourth node (for instance, OSS) configured to receive a standby signal (for instance, MC), wherein the circuit control logic circuitry is configured to switch to said second mode of operation (from said first mode of operation, for instance) in response to said standby signal received (for instance, 1001) at said fourth node.

A circuit as exemplified herein may comprise current sensing circuitry (for instance, 12B, SR, 24) configured to sense the intensity of the current flowing through the electrical load, the current sensing circuitry coupled to the control logic circuitry, wherein the control logic circuitry is configured to switch from said first mode of operation to said second mode of operation in response to the current flowing through the electrical load dropping to a lower threshold (for instance, Vref_2).

In a circuit as exemplified herein, the current sensing circuitry may comprise a sensing transistor (for instance, 12B) having a control node coupled to said third node and a current path therethrough included in a current feedback line from said first node (for instance, VBAT+) to a further node (for instance, MS) configured to be coupled to ground, preferably via a resistor (for instance, SR).

A circuit as exemplified herein may comprise current sensing circuitry (for instance 22 and 12A) sensitive to the intensity of the current flowing through the electrical load, the current sensing circuitry coupled to the control logic circuitry, wherein the control logic circuitry is configured to switch from said second mode of operation to said first mode of operation in response to the current flowing through the electrical load increasing to an upper threshold (as determined, for instance, by Vref_1).

A circuit as exemplified herein may comprise supply regulator circuitry (for instance, 16) having a first supply regulator section (for instance, 16A) and a second supply regulator section (for instance, 16B), the second supply regulator section having lower energy absorption than the first supply regulator section, wherein the control logic circuitry is coupled (for instance, stdbyon) to said supply regulator circuitry and configured to enable the first supply regulator section during the first mode of operation and the second supply regulator section during the second mode of operation.

In a circuit as exemplified herein, the secondary electronic switch (for instance, 12A) may comprise a low-power electronic switch.

An electronic switch such a MOSFET transistor having a RDSon resistance (at full VGs) of about 10 Ohm may be exemplary of such a low-power switch.

A circuit as exemplified herein may include said electronic switch having a control node (as assumed in FIG. 1, for instance), and the secondary electronic switch may comprise a low-power electronic switch configured to be traversed during conduction by a current of lower intensity than the current traversing said electronic switch during conduction.

A system as exemplified herein (a power distribution system for use in the automotive sector, for instance) may comprise:
an electrical supply source (for instance, SS);
an electrical load (for instance, L);
an electronic switch (for instance, 12) having a control node to switch the electronic switch between a conductive state, wherein the electrical load is coupled to the supply source via the electronic switch, and a non-conductive state (wherein the electrical load is not coupled to the supply source via the electronic switch); and
a circuit (for instance, 10, with the switch 12 being a distinct component from the circuit—as illustrated in FIGS. 2 and 4, or included in the circuit as assumed in FIG. 1) as exemplified herein wherein the first node (for instance, VBAT+) is coupled to the electrical supply source (for instance, SS), the second node (for instance, OUT) is coupled to the electrical load (for instance, L) and the third node (for instance, GD) is coupled to the control node of the electronic switch (for instance, 12).

A system as exemplified herein may comprise energy absorbing circuitry (see, for instance, the functionalities I,II,III in the system 100 FIG. 1) supplied by said supply source (for instance, SS), the energy absorbing circuitry settable to a low-energy absorption mode in response to the control logic circuitry (for instance, 20) in said circuit (for instance, 10) being actuated in said second mode of operation (for instance 1002, with the signal stdbyon distributed to the functionalities I,II,III in the system 100 in FIG. 1).

A method of operating a circuit or a system as exemplified herein may comprise actuating the control logic circuitry (for instance, 20), alternately:
in said first mode of operation (for instance, 1000), wherein the first switch control signal (for instance, Switch_GD-on/off) drives the electronic switch (for instance, 12) to the conductive state and the second switch control signal (for instance, Switch_BS-on/off) drives the secondary electronic switch (for instance, 12A) to a non-conductive state; and
in said second mode of operation (for instance, 1002), wherein the first switch control signal (for instance, Switch_GD-on/off) drives the electronic switch (for instance, 12) to the non-conductive state and the second switch control signal (for instance, Switch_BS-on/off) drives the secondary electronic switch (for instance, 12A) to a conductive state, wherein the electrical load (for instance, L) is coupled to the supply source (for instance, SS) via the secondary electronic switch.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is determined by the annexed claims.

The invention claimed is:

1. A circuit, comprising:
a first node configured to be coupled to an electrical supply source;
a second node configured to be coupled to an electrical load;
a third node configured to be coupled to a control node of an electronic switch that is coupled between the electrical supply source and the electrical load;
a secondary electronic switch coupled between the first node and the second node;
control logic circuitry configured to provide a first switch control signal applied through said third node to the control node of the electronic switch for controlling switching of the electronic switch between a conductive state for delivering a first current level to the electrical load from the electrical supply source, and a non-conductive state;
wherein said control logic circuitry is further configured to provide a second switch control signal applied to a control node of the secondary electronic switch for controlling switching of the secondary electronic switch between a conductive state for delivering a second current level to the electrical load from the electrical supply source, and a non-conductive state, wherein the second current level is lower than the first current level;
wherein the first switch control signal and the second switch control signal control the electronic switch and secondary electronic switch such that, alternately:
in a first mode of operation, the first switch control signal switches the electronic switch to the conductive state to deliver the first current level to the second node and the second switch control signal switches the secondary electronic switch to the non-conductive state; and
in a second mode of operation, the first switch control signal switches the electronic switch to the non-conductive state and the second switch control signal switches the secondary electronic switch to the conductive state to deliver the second current level to the second node;
wherein the electronic switch is a first conductivity type MOSFET device and the secondary electronic switch is a second conductivity type MOSFET device.

2. The circuit of claim 1, further comprising a fourth node configured to receive a standby signal, wherein the control logic circuitry is configured to switch from said first mode of operation to said second mode of operation in response to assertion of said standby signal.

3. The circuit of claim 1, further comprising:
current sensing circuitry configured to sense an intensity of current flowing through the electrical load; and
wherein the control logic circuitry is configured to switch from said first mode of operation to said second mode of operation in response to the current sensing circuitry detecting current flowing through the electrical load dropping to a lower threshold.

4. The circuit of claim 3, wherein the current sensing circuitry comprises a sensing transistor having a control node coupled to said third node and a current path therethrough included in a current feedback line from said first node to a further node that is coupled to ground via a resistor.

5. The circuit of claim 3, wherein the control logic circuitry is further configured to switch from said second mode of operation to said first mode of operation in response to the current sensing circuitry detecting current flowing through the electrical load increasing to an upper threshold.

6. The circuit of claim 1, wherein the electronic switch is a higher power transistor for delivering the first current level and the secondary electronic switch is a lower power transistor for delivering the second current level.

7. A circuit, comprising:
a first node configured to be coupled to an electrical supply source;
a second node configured to be coupled to an electrical load;
a third node configured to be coupled to a control node of an electronic switch that is coupled between the electrical supply source and the electrical load;
a secondary electronic switch coupled between the first node and the second node;
control logic circuitry configured to provide a first switch control signal applied through said third node to the control node of the electronic switch for controlling switching of the electronic switch between a conductive state for delivering a first current level to the electrical load from the electrical supply source, and a non-conductive state;
wherein said control logic circuitry is further configured to provide a second switch control signal applied to a control node of the secondary electronic switch for controlling switching of the secondary electronic switch between a conductive state for delivering a second current level to the electrical load from the electrical supply source, and a non-conductive state, wherein the second current level is lower than the first current level;
wherein the first switch control signal and the second switch control signal control the electronic switch and secondary electronic switch such that, alternately:
in a first mode of operation, the first switch control signal switches the electronic switch to the conductive state to deliver the first current level to the second node and the second switch control signal switches the secondary electronic switch to the non-conductive state; and
in a second mode of operation, the first switch control signal switches the electronic switch to the non-conductive state and the second switch control signal switches the secondary electronic switch to the conductive state to deliver the second current level to the second node;
supply regulator circuitry having a first supply regulator section and a second supply regulator section, the second supply regulator section having lower energy absorption than the first supply regulator section; and
wherein the control logic circuitry is further configured to enable the first supply regulator section during the first mode of operation and alternatively enable the second supply regulator section during the second mode of operation.

8. The circuit of claim 7, further comprising a fourth node configured to receive a standby signal, wherein the control logic circuitry is configured to switch from said first mode of operation to said second mode of operation in response to assertion of said standby signal.

9. The circuit of claim 7, wherein the electronic switch is a higher power transistor for delivering the first current level and the secondary electronic switch is a lower power transistor for delivering the second current level.

10. A circuit, comprising:
a first node configured to be coupled to an electrical supply source;
a second node configured to be coupled to an electrical load;
a third node configured to be coupled to a control node of an electronic switch that is coupled between the electrical supply source and the electrical load;
a secondary electronic switch coupled between the first node and the second node;
control logic circuitry configured to provide a first switch control signal applied through said third node to the control node of the electronic switch for controlling switching of the electronic switch between a conductive state for delivering a first current level to the electrical load from the electrical supply source, and a non-conductive state;
wherein said control logic circuitry is further configured to provide a second switch control signal applied to a control node of the secondary electronic switch for controlling switching of the secondary electronic switch between a conductive state for delivering a second current level to the electrical load from the electrical supply source, and a non-conductive state, wherein the second current level is lower than the first current level;
wherein the first switch control signal and the second switch control signal control the electronic switch and secondary electronic switch such that, alternately:
in a first mode of operation, the first switch control signal switches the electronic switch to the conductive state to deliver the first current level to the second node and the second switch control signal switches the secondary electronic switch to the non-conductive state; and
in a second mode of operation, the first switch control signal switches the electronic switch to the non-conductive state and the second switch control signal switches the secondary electronic switch to the conductive state to deliver the second current level to the second node; and
energy absorbing circuitry supplied by said electrical supply source, wherein the energy absorbing circuitry is settable to a low energy absorption mode in response to said second mode of operation.

11. The circuit of claim 10, further comprising:
said electrical supply source coupled to said first node;
said electrical load coupled to said second node; and
said electronic switch with the control node coupled to said third node.

12. The circuit of claim 11, wherein said electronic switch is an external device.

13. The circuit of claim 10, further comprising a fourth node configured to receive a standby signal, wherein the control logic circuitry is configured to switch from said first mode of operation to said second mode of operation in response to assertion of said standby signal.

14. The circuit of claim 10, wherein the electronic switch is a higher power transistor for delivering the first current level and the secondary electronic switch is a lower power transistor for delivering the second current level.

15. A circuit, comprising:
a first transistor controllable to deliver a first current level to an electrical load in an on state;
a second transistor controllable to deliver a second current level to the electrical load in an on state, wherein the second current level is less than the first current level;
control logic circuitry configured to provide a first switch control signal to a control node of the first transistor and provide a second switch control signal to a control node of the second transistor;
wherein:
in a first mode of operation, the control logic circuitry generates the first switch control signal to switch the first transistor to the on state to deliver the first current level to the electronic load and generates the second switch control signal to switch the second transistor to an off state; and
in a second mode of operation, the control logic circuitry generates the second switch control signal to switch the second transistor to the on state to deliver the second current level to the electronic load and generates the first switch control signal to switch the first transistor to an off state;
wherein the first transistor has a first conductivity type and the second transistor has a second conductivity type.

16. The circuit of claim 15, wherein the control logic circuitry is responsive to receipt of a standby signal to switch from said first mode of operation to said second mode of operation.

17. The circuit of claim 15, further comprising:
current sensing circuitry configured to sense an intensity of current flowing through the electrical load; and
wherein the control logic circuitry is configured to switch from said first mode of operation to said second mode of operation in response to the current sensing circuitry detecting current flowing through the electrical load dropping to a lower threshold.

18. The circuit of claim 17, wherein the current sensing circuitry comprises a sensing transistor having a control node shared with the control node of the first transistor and a current path included in a current feedback line.

19. The circuit of claim 17, wherein the control logic circuitry is further configured to switch from said second mode of operation to said first mode of operation in response to the current sensing circuitry detecting current flowing through the electrical load increasing to an upper threshold.

20. The circuit of claim 15, wherein the first transistor is a higher power transistor and the second transistor is a lower power transistor.

21. The circuit of claim 15, wherein the second transistor is integrated into a control circuit and the first transistor is external to the control circuit.

22. A circuit, comprising:
a first node configured to be coupled to an electrical supply source;
a second node configured to be coupled to an electrical load;
a third node configured to be coupled to a control node of an electronic switch that is coupled between the electrical supply source and the electrical load;
a secondary electronic switch coupled between the first node and the second node;

control logic circuitry configured to provide a first switch control signal applied through said third node to the control node of the electronic switch for controlling switching of the electronic switch between a conductive state for delivering a first current level to the electrical load from the electrical supply source, and a non-conductive state;
wherein said control logic circuitry is further configured to provide a second switch control signal applied to a control node of the secondary electronic switch for controlling switching of the secondary electronic switch between a conductive state for delivering a second current level to the electrical load from the electrical supply source, and a non-conductive state, wherein the second current level is lower than the first current level;
wherein the first switch control signal and the second switch control signal control the electronic switch and secondary electronic switch such that, alternately:
in a first mode of operation, the first switch control signal switches the electronic switch to the conductive state to deliver the first current level to the second node and the second switch control signal switches the secondary electronic switch to the non-conductive state; and
in a second mode of operation, the first switch control signal switches the electronic switch to the non-conductive state and the second switch control signal switches the secondary electronic switch to the conductive state to deliver the second current level to the second node;
current sensing circuitry configured to sense an intensity of current flowing through the electrical load; and
wherein the control logic circuitry is configured to:
switch from said first mode of operation to said second mode of operation in response to the current sensing circuitry detecting current flowing through the electrical load dropping to a lower threshold; and
switch from said second mode of operation to said first mode of operation in response to the current sensing circuitry detecting current flowing through the electrical load increasing to an upper threshold;
wherein the current sensing circuitry comprises a sensing transistor having a control node coupled to said third node and a current path therethrough included in a current feedback line from said first node to a further node that is coupled to ground via a resistor.

23. The circuit of claim 22, further comprising a fourth node configured to receive a standby signal, wherein the control logic circuitry is configured to switch from said first mode of operation to said second mode of operation in response to assertion of said standby signal.

24. The circuit of claim 22, wherein the electronic switch is a higher power transistor for delivering the first current level and the secondary electronic switch is a lower power transistor for delivering the second current level.

25. A circuit, comprising:
a first transistor controllable to deliver a first current level to an electrical load in an on state;
a second transistor controllable to deliver a second current level to the electrical load in an on state, wherein the second current level is less than the first current level;
control logic circuitry configured to provide a first switch control signal to a control node of the first transistor and provide a second switch control signal to a control node of the second transistor;

wherein:
  in a first mode of operation, the control logic circuitry generates the first switch control signal to switch the first transistor to the on state to deliver the first current level to the electronic load and generates the second switch control signal to switch the second transistor to an off state; and
  in a second mode of operation, the control logic circuitry generates the second switch control signal to switch the second transistor to the on state to deliver the second current level to the electronic load and generates the first switch control signal to switch the first transistor to an off state;
current sensing circuitry configured to sense an intensity of current flowing through the electrical load;
wherein the control logic circuitry is configured to:
  switch from said first mode of operation to said second mode of operation in response to the current sensing circuitry detecting current flowing through the electrical load dropping to a lower threshold; and
  switch from said second mode of operation to said first mode of operation in response to the current sensing circuitry detecting current flowing through the electrical load increasing to an upper threshold;
wherein the current sensing circuitry comprises a sensing transistor having a control node shared with the control node of the first transistor and a current path included in a current feedback line.

26. The circuit of claim 25, wherein the control logic circuitry is responsive to receipt of a standby signal to switch from said first mode of operation to said second mode of operation.

27. The circuit of claim 25, wherein the first transistor is a higher power transistor and the second transistor is a lower power transistor.

28. The circuit of claim 25, wherein the first transistor has a first conductivity type and the second transistor has a second conductivity type.

* * * * *